(12) United States Patent  
Wang et al.

(10) Patent No.: US 8,345,500 B2
(45) Date of Patent: Jan. 1, 2013

(54) MEMORY HAVING A DISABLING CIRCUIT AND METHOD FOR DISABLING THE MEMORY

(75) Inventors: Shih-Hsing Wang, Hsinchu (TW); Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 226 days.

(21) Appl. No.: 12/912,748

(22) Filed: Oct. 27, 2010

(65) Prior Publication Data

US 2011/0176381 A1  Jul. 21, 2011

(30) Foreign Application Priority Data

Jan. 21, 2010  (TW) ................................ 99101644 A

(51) Int. Cl.
*G11C 17/18* (2006.01)

(52) U.S. Cl. ................ 365/225.7; 365/191; 365/230.08; 365/189.09

(58) Field of Classification Search ............... 365/225.7, 365/191, 230.08, 189.09
See application file for complete search history.

(56) References Cited

U.S. PATENT DOCUMENTS 5,966,339 A * 10/1999 Hsu et al. .................. 365/225.7

\* cited by examiner

*Primary Examiner* — Thong Q Le
(74) *Attorney, Agent, or Firm* — Winston Hsu; Scott Margo

(57) ABSTRACT

A memory with disabling circuit includes a memory matrix and a disabling circuit. The memory matrix includes a data input/output end and an output enable end. The disabling circuit includes a fuse and an output end. When the fuse is not blown, the disabling circuit transmits the signal of the data input/output end to the output end according to the signal of the output enable end. When the fuse is blown, the disabling circuit generates a tri-state to the output end. Therefore, external circuits cannot perform actions of reading or writing to access the memory matrix.

8 Claims, 4 Drawing Sheets

| Fuse | OE | IO | OUT |
|---|---|---|---|
| Not blown | 0 | - | Tri-state |
| Not blown | 1 | 0 | 0 |
| Not blown | 1 | 1 | 1 |
| Blown | - | - | Tri-state |

FIG. 3

MEMORY HAVING A DISABLING CIRCUIT AND METHOD FOR DISABLING THE MEMORY

BACKGROUND OF THE INVENTION

1. Field of the Invention

The present invention is related to a memory, and more particularly, to a memory with a disabling circuit for disabling the memory when the memory is defined as a NG (Not Good) part.

2. Description of the Prior Art

Semiconductor chips, for applications such as memory, have been made from wafers of semiconductor material whereby each wafer is split up into a plurality of dies. During the manufacture process, the wafer undergoes a number of micro-fabrications such as doping, etching, deposition of various materials and photolithographic patterning. Subsequently the wafer is then diced and further packaged.

Generally, wafer testing is performed before the wafer is sent to die preparation/packaging. The process of wafer testing in general can be referred to in several types such as Wafer Sort (WS), Wafer Final Test (WFT), Electronic Die Sort (EDS) and Circuit Probe (CP). During wafer testing all dies present on the wafer are tested by applying specific test patterns. If a die fails a certain test pattern, this particular die is classified as an NG part.

Wafer fabrication plants and test/package sites are of different vendors, or situated at different countries or locations. After the wafers are fabricated the wafer fabrication plants generally carry out a simple probe test to the wafers. The wafers are then sent to test/package sites for back-end processing (e.g. test and package). A wafer map is included to show the distribution of the NG parts and other relative data, so the test/package sites can skip the NG parts accordingly. However, it is still possible for the NG parts to be mistakenly packaged. Although the parameters of the final test is designed to be tighter than the probe test, the NG parts may still pass the final test due to issues such as testing hardware, testing environment, and test item variation. In addition, even if the NG parts are successfully filtered out by the final test, the NG parts have already been packaged into memory ICs (Integrated Circuits), affecting the yield, testing efficiency and the cost.

SUMMARY OF THE INVENTION

The present invention discloses a memory. The memory comprises a memory matrix and a disabling circuit. The memory matrix comprises a data input/output end and an output enable end. The disabling circuit is coupled to the data input/output end and the output enable end. The disabling circuit comprises a fuse and an output end, for generating a logic signal to the output end according to logic signals of the data input/output end and the output enable end when the fuse is not blown, and generating a tri-state at the output end when the fuse is blown.

The present invention further discloses a method for disabling a memory. The method comprises disposing a disabling circuit with a fuse at an output end of the memory; and blowing the fuse for the disabling circuit to generate a tri-state at the output end of the memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a table illustrating the signal relationship between the memory matrix and the disabling circuit.

DETAILED DESCRIPTION

Therefore, the present invention utilizes a disabling circuit to control the output of a memory. When any memory units of a memory matrix of the memory is classified as an NG part, the disabling circuit outputs a tri-state (e.g. high impedance) to the output end of the memory matrix, effectively "removing" the output of the memory. This way, in the subsequent testing or processing, the memory cannot be accessed and can be identified as an NG part straight away.

Figure 1:
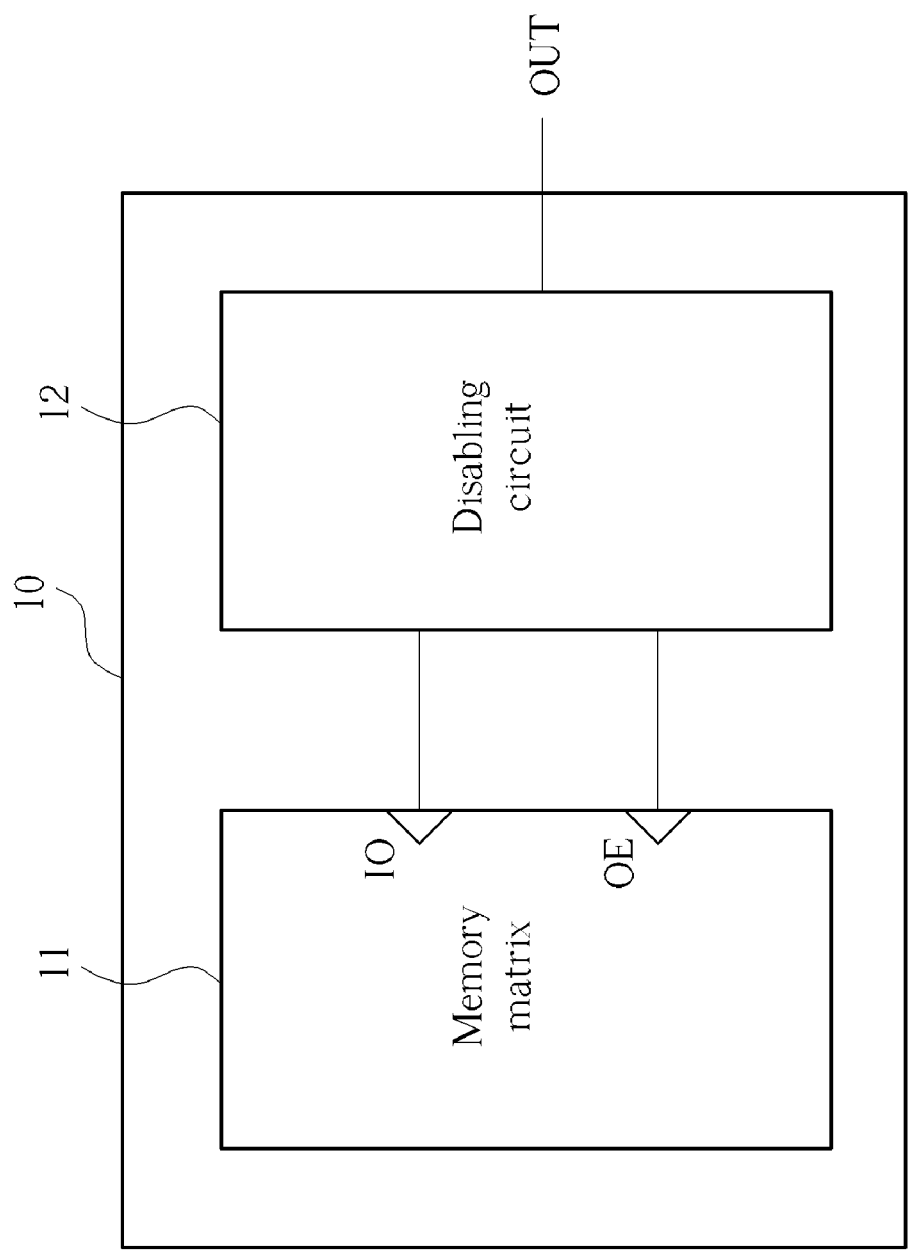
FIG. 1 is a diagram illustrating the memory of the present invention.

Please refer to FIG. 1. FIG. 1 is a diagram illustrating the memory 10 of the present invention. Memory 10 comprises a memory matrix 11, a disabling circuit 12 and an output end OUT. The disabling circuit is coupled to a data input/output end IO and an output enable end OE of the memory matrix 11 at the same time. The memory matrix 11 comprises a plurality of memory units; the data stored in the memory units are transmitted to the output end OUT through the disabling circuit 12. The disabling circuit 12 is able to control the output end OUT of the memory 10 for generating a tri-state (e.g. high impedance) to the output end OUT, consequently external circuits such as the tester or other devices are unable to perform read or write actions to the memory 10.

Figure 2:
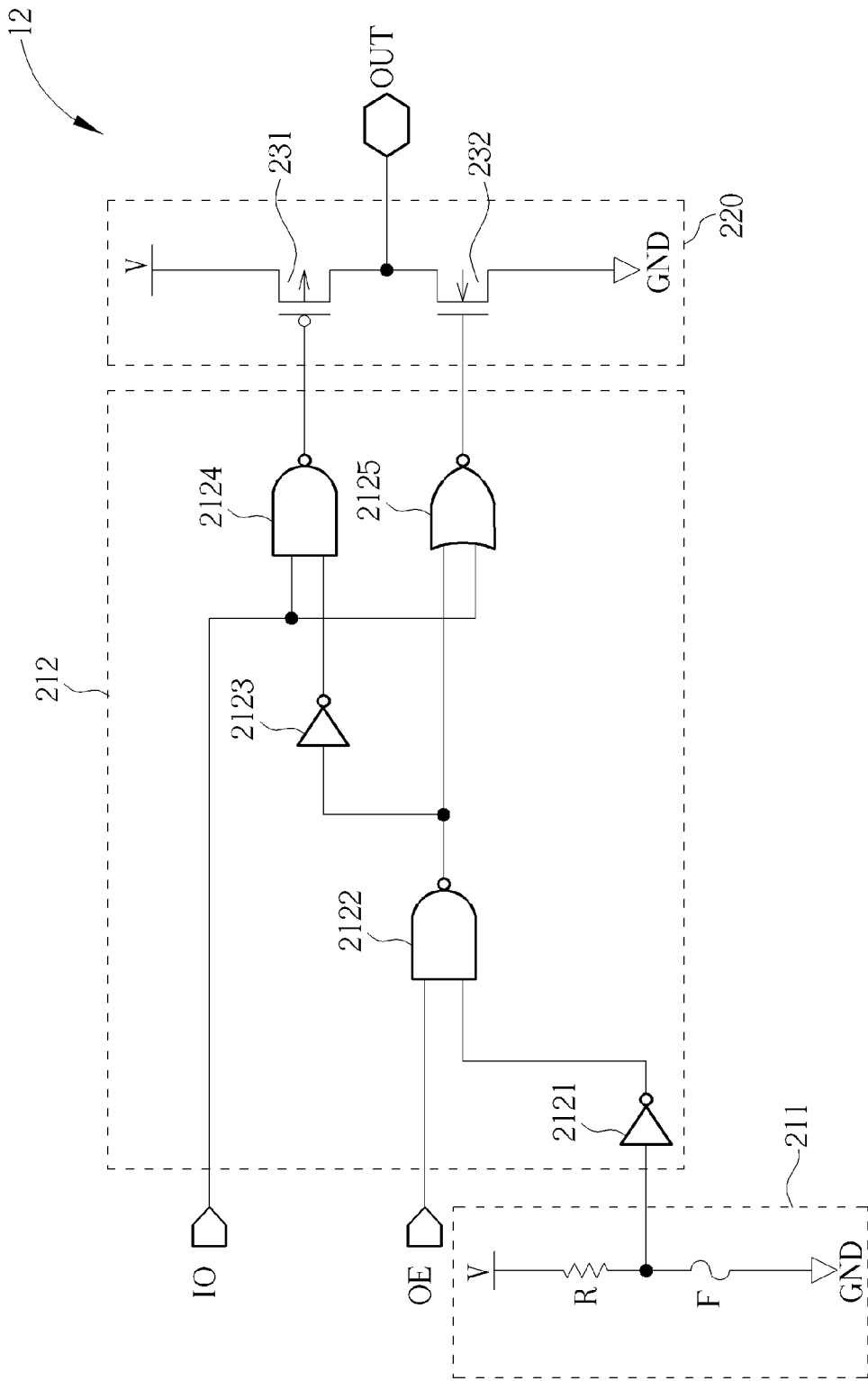
FIG. 2 is a diagram illustrating the disabling circuit according to an embodiment of the present invention.

Please refer to FIG. 2. FIG. 2 is a diagram illustrating the disabling circuit 12 according to an embodiment of the present invention. The disabling circuit 12 comprises a fuse circuit 211, an output control circuit 212 and an output buffer circuit 220. The fuse circuit 211 comprises a resistor R and a fuse F. A first end of the resistor R is coupled to a voltage source V, and a second end of the resistor R is coupled to an output end of the fuse circuit 211. A first end of the fuse F is coupled to the second end of the resistor R, and a second end of the fuse F is coupled to a ground end GND. The state of the fuse F corresponds to the state/condition of the memory matrix 11. For instances, when the memory matrix 11 is classified as an NG part, the fuse F is blown. The fuse circuit 211 outputs a logic signal according to the state of the fuse F (e.g. whether the fuse F is blown). More specifically, when the fuse F is not blown, the voltage level of the fuse circuit 211 is pulled to a low voltage level of the ground end GND so the fuse circuit 211 outputs a signal of logic "0" (e.g. the first logic signal); when the fuse F is blown, the voltage level of the fuse circuit 211 is pulled to a high voltage level of the voltage source V and the fuse circuit 211 outputs a signal of logic "1" (e.g. the second logic signal). In the present embodiment, when the memory matrix 11 is classified as an NG part, the fuse F is blown. In some other embodiments, the fuse F can be controlled by the user. For instances, the condition for blowing the fuse F can be defined by the user and not limited to when the memory matrix 11 is classified as an NG part.

The output control circuit 212 is coupled to the fuse circuit 211, the data input/output end IO and the output enable end OE at the same time. The output control circuit 212 outputs a logic signal according to the signals of the data input/output end IO and the output enable end OE. The output control circuit 212 comprises a first inverter 2121, a first NAND gate 2122, a second inverter 2123, a second NAND gate 2124 and a NOR gate 2125. The first inverter 2121 is coupled to the output end of the fuse circuit 211 for inverting the signal outputted by the fuse circuit 211. A first end of the first NAND gate 2122 is coupled to the output enable end OE, and a second end of the first NAND gate 2122 is coupled to an output end of the first inverter 2121. The first NAND gate 212 is utilized to perform logic NAND calculation to the signal outputted by the output enable end OE and the first inverter 2121. The second inverter 2123 is coupled to an output end of the first NAND gate 2122, for inverting the signal outputted by the first NAND gate 2122. A first end of the second NAND gate 2124 is coupled to the data input/output end IO of the memory matrix 11, and a second end of the second NAND gate 2124 is coupled to an output end of the second inverter 2123. The second NAND gate 2124 is utilized to perform logic NAND calculation to the signal outputted by the data input/output end IO and the second inverter 2123. A first end of the NOR gate 2125 is coupled to the output end of the first NAND gate 2122, and a second end of the NOR gate 2125 is coupled to the data input/output end IO of the memory matrix 11. The NOR gate 2125 is utilized to perform logic NOR calculation to the signal outputted by the first NAND gate 2122 and the data input/output end IO.

The output buffer circuit 220 is coupled between the output control circuit 212 and the output end OUT of the memory 10. The output buffer circuit 220 outputs the data stored in the memory matrix 11 according to the signal outputted by the output control circuit 212. The output buffer circuit 220 comprises a first switch 231 and a second switch 232. A first end of the first switch 231 is coupled to the voltage source V; a second end of the first switch 231 is coupled to the output end OUT of the memory 10; a control end of the first switch 231 is coupled to an output end of the second NAND gate 2124. A first end of the second switch 232 is coupled to the output end OUT of the memory 10; a second end of the second switch 232 is coupled to the ground end GND; a control end of the switch 232 is coupled to an output end of the NOR gate 2125. In the present embodiment, the first switch 231 is realized with a PMOS (P-type Metal-Oxide Semiconductor) transistor, and the second switch 232 is realized with an NMOS (N-type Metal-Oxide Semiconductor) transistor.

When the fuse F is blown (e.g. the memory matrix 11 is classified as an NG part), the fuse circuit 211 outputs a signal of logic "1". The first inverter 2121 inverts the signal of logic "1" to logic "0". The first NAND gate 2122 performs logic NAND calculation to the signals outputted by the output enable end OE and the first inverter 2121; since the signal outputted by the fuse circuit 211 is inverted to logic "0" by the first inverter 2121 when the fuse F is blown, the first NAND gate 2122 outputs the signal of logic "1" regardless of whether the signal outputted by the enable end OE is of logic "0" or logic "1". The second inverter 2123 inverts the signal of logic "1" outputted by the first NAND gate 2122 to logic "0". The second NAND gate 2124 performs logic NAND calculation to the signals outputted by the data input/output end IO and the second inverter 2123; since the signal outputted by the second inverter 2123 is of logic "0", the second NAND gate 2124 outputs the signal of logic "1" regardless of whether the data input/output end IO outputs the signal of logic "0" or "1". The NOR gate 2125 performs logic NOR calculation to the signals outputted by the first NAND gate 2122 and the data input/output end IO; since the signal outputted by the first NAND gate 2122 is of logic "1", the NOR gate 2125 outputs a signal of logic "0" regardless of whether the data input/output end IO outputs the signal of logic "0" or "1". Since the second NAND gate 2124 and the NOR gate 2125 output signals of logic "1" and "0" respectively, the first switch 231 (e.g. PMOS transistor) and the second switch 232 (e.g. NMOS transistor) are both turned off accordingly, consequently generating the tri-state (e.g. high impedance) to the output end OUT of the memory 10.

It is noted that, the disabling circuit 12 is not only limited to the embodiment as disclosed in FIG. 2. Under certain predetermined conditions (e.g. when the memory matrix is classified as NG parts), as long as the disabling circuit is able to output a signal of a predetermined logic for the output end of the disabling circuit to be in a certain status (e.g. high impedance), so external devices cannot access the memory matrix; such disabling circuits are in compliance to the principle of present invention.

Please refer to FIG. 2 and FIG. 3 together. FIG. 3 is a table illustrating the signal relationship between the memory matrix 11 and the disabling circuit 12. Under normal operation, the output enable end OE controls whether access (e.g. read and write) to the memory matrix 11 is allowed. When the output enable end OE is enabled (e.g. the output enable end OE outputs a signal of logic "1"), the disabling circuit 12 outputs the data of the data input/output end IO of the memory matrix 11. In other words, when the data input/output end IO of the memory matrix 11 outputs the signal of logic "0" or "1", the output end of the disabling circuit 12 correspondingly outputs the signal of logic "0" or "1". On the other hand, when the output enable end OE is disabled (e.g. the output enable end OE outputs a signal of logic "0"), the output end of the disabling circuit 12 is represented as high impedance, meaning the memory matrix 11 cannot be accessed. However, when the fuse F is blown (e.g. when the memory matrix 11 is classified as an NG part), the output end of the disabling circuit 12 is represented as high impedance regardless of whether the output enable end OE is enabled or disabled, so the memory matrix 11 cannot be accessed.

Figure 4:
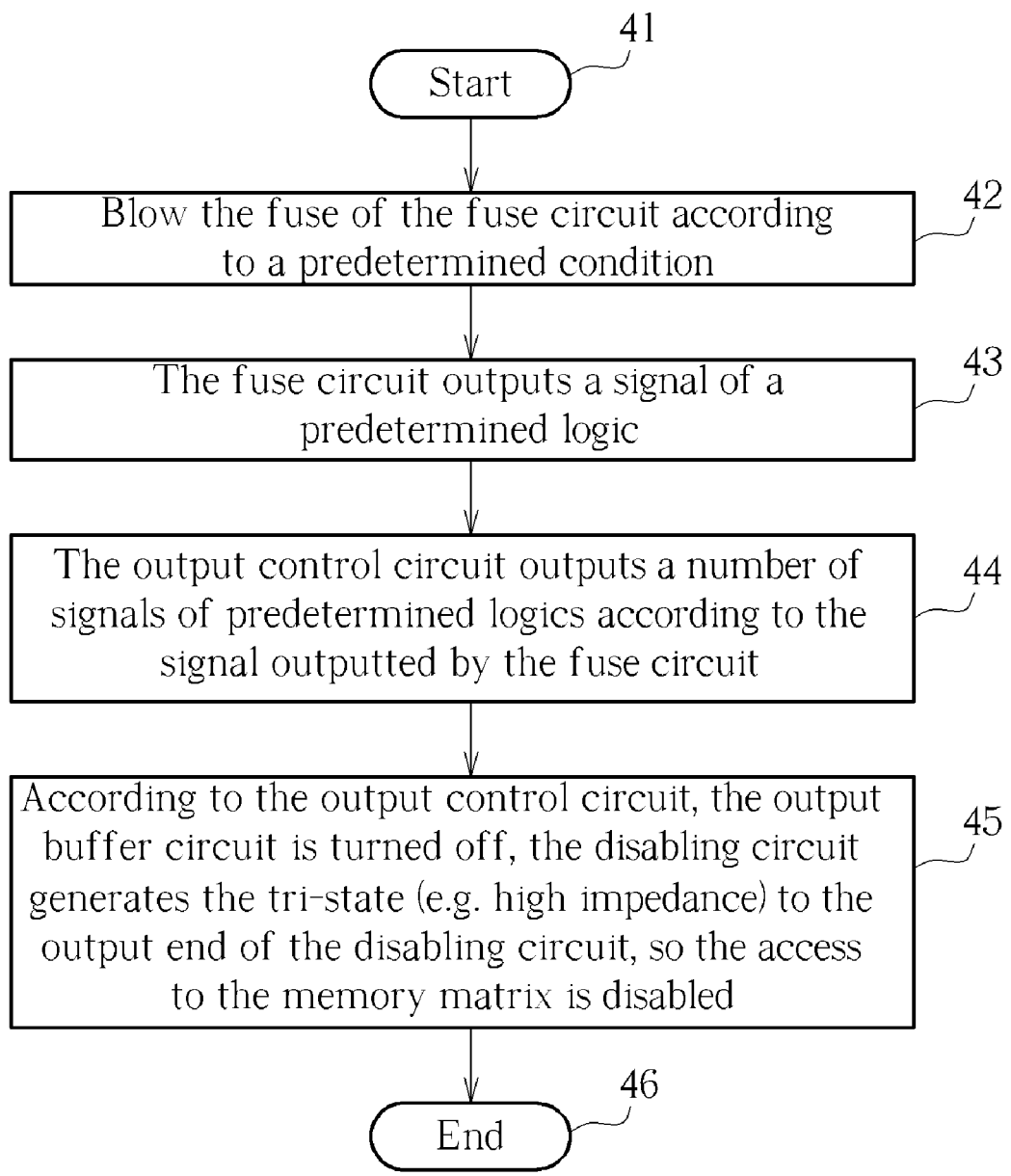
FIG. 4 is a flow chart illustrating the method of disabling the memory of the present invention.

Please refer to FIG. 2 and FIG. 4 at the same time. FIG. 4 is a flow chart illustrating the method 40 of disabling the memory. The steps are detailed as below:

Step 41: Start;

Step 42: Blow the fuse F of the fuse circuit 211 according to a predetermined condition;

Step 43: The fuse circuit 211 of the output control circuit 212 of the memory matrix 11 outputs a signal of a predetermined logic;

Step 44: The output control circuit 212 outputs a number of signals of predetermined logics according to the signal outputted by the fuse circuit 211;

Step 45: According to the output control circuit 212, the output buffer circuit 220 is turned off, the disabling circuit 12 generates the tri-state (e.g. high impedance) to the output end of the disabling circuit 12 of the memory matrix 11, so the access to the memory matrix 11 is disabled;

Step 46: End.

In step 42, the fuse F of the fuse circuit 211 is blown according to a predetermined condition defined by the user. In the present embodiment, the fuse F is blown when the memory matrix 11 (or the memory 10) is classified as an NG part during wafer test. In addition, in other embodiments, even if the memory matrix 11 has passed the wafer test, the memory matrix 11 can still be classified as an NG part according to any quality concerns defined by the user at any stages.

In step 43, when the fuse F of the fuse circuit 211 is blown, the fuse circuit 211 of the memory matrix 11 outputs a signal of a predetermined logic. In the present embodiment, when the memory matrix 11 functions properly and passes the wafer test, the fuse circuit 211 outputs the signal of logic "0" (e.g. the output end of the fuse circuit 211 is pulled to a low voltage level of the ground end GND). When the memory matrix 11 is classified as an NG part, the fuse circuit 211 outputs the signal of logic "1" (e.g. the output end of the fuse circuit 211 is pulled to a high voltage level of the voltage source V).

In step 44, the output control circuit 212 outputs signals according to the output of the fuse circuit 211. In the present embodiment, when the fuse circuit 211 outputs the signal of logic "1" (e.g. when the memory matrix 11 is a NG unit), the second NAND gate 2124 and the NOR gate 2125 of the output control circuit 212 output signals of logic "1" and "0" respectively, regardless of whether the signals of the data input/output end IO and the output enable end OE are logic "0" or "1".

In step 45, since the signal outputted by the second NAND gate 2124 and the NOR gate 2125 are of logic "1" and "0" respectively, the first switch 231 and the second switch 232 of the output buffer circuit 220 are turned off accordingly, causing the output end of the disabling circuit 12 (e.g. equivalent to the output end of the output buffer circuit 220) to become the tri-state (e.g. high impedance), consequently the external devices such as tester cannot access the memory matrix 11 via the disabling circuit 12.

In conclusion, when the memory matrix is classified as an NG part, the disabling circuit can output a signal of a predetermined logic for the output end of the disabling circuit to become high impedance, and then the memory matrix cannot be accessed for reading or writing. This way, possible test/package errors and the test time can be reduced as the memory matrix can be recognized as an NG part without further testing or verification, consequently eliminating the risk of the NG part passing the final test. Therefore the yield and the testing efficiency can be improved and the cost can be reduced.

Those skilled in the art will readily observe that numerous modifications and alterations of the device and method may be made while retaining the teachings of the invention.

What is claimed is:

1. A memory, comprising:
    a memory matrix, comprising a data input/output end and an output enable end; and
    a disabling circuit, coupled to the data input/output end and the output enable end, the disabling circuit comprising a fuse and an output end, for outputting a logic signal outputted from the data input/output end to the output end when the fuse is not blown and the output enable end outputs an enabled signal, and generating a tri-state at the output end when the fuse is blown or the output enable end outputs a disabled signal.

2. The memory of claim 1, wherein the disabling circuit further comprises:
    a fuse circuit, for outputting a first logic signal when the fuse is not blown and outputting a second logic signal when the fuse is blown;
    an output buffer circuit, for generating the first logic signal, the second logic signal or the tri-state at the output end of the disabling circuit; and
    an output control circuit, for controlling the output buffer circuit, the output control circuit transmitting the logic signal of the data input/output end to the output end of the disabling circuit when the fuse is not blown and the output enable end outputs the enabled signal, and outputting the tri-state when the fuse is blown or when the output enable end outputs the disabled signal.

3. The memory of claim 2, wherein the output control circuit comprises:
    a first inverter, coupled to the fuse circuit, for inverting a signal outputted by the fuse circuit;
    a first NAND gate, for performing NAND calculation to signals outputted by the output enable end and the first inverter, comprising:
        a first end, coupled to the output enable end; and
        a second end, coupled to an output end of the first inverter;
    a second inverter, coupled to an output end of the first NAND gate, for inverting a signal outputted by the first NAND gate;
    a second NAND gate, for performing NAND calculation to signals outputted by the data input/output end of the memory matrix and the second inverter, comprising:
        a first end, coupled to the data input/output end of the memory matrix;
        a second end, coupled to an output end of the second inverter; and
        an output end; and
    a NOR gate, for performing NOR calculation to signals outputted by the first NAND gate and date input/output end of the memory matrix, comprising:
        a first end, coupled to the output end of the first NAND gate;
        a second end, coupled to the data input/output end; and
        an output end.

4. The memory of claim 3, wherein the output buffer circuit comprises:
    a first switch, comprising:
        a first end, coupled to a voltage source;
        a second end, coupled to the output end of the memory; and
        a control end, coupled to the output end of the second NAND gate; and
    a second switch, comprising:
        a first end, coupled to the output end of the memory;
        a second end, coupled to a ground end; and
        a control end, coupled to the output end of the NOR gate.

5. The memory of claim 4, wherein the first switch is a PMOS (P-type metal-Oxide Semiconductor) transistor.

6. The memory of claim 4, wherein the second switch is an NMOS (N-type metal-Oxide Semiconductor) transistor.

7. A method for disabling a memory, comprising:
    disposing a disabling circuit with a fuse at a data input/output end of the memory;
    the disabling circuit outputting a logic signal outputted from the data input/output end of the memory at an output end of the disabling circuit when the fuse is not blown and an output enable end of the memory outputs an enabled signal; and
    the disabling circuit generating a tri-state at the output end of the disabling circuit when the fuse is blown or the output enable end of the memory outputs a disabled signal.

8. The method of claim 7, wherein the disabling circuit outputting the logic signal outputted from the data input/output end of the memory at the output end of the disabling circuit comprises:
    the output end of the disabling circuit outputting a first logic signal when the data input/output end outputs the first logic signal; and
    the output end of the disabling circuit outputting a second logic signal when the data input/output end outputs the second logic signal.

* * * * *